US012561593B2

(12) United States Patent　　(10) Patent No.: US 12,561,593 B2
Casparis et al.　　(45) Date of Patent: Feb. 24, 2026

(54) METHOD FOR DETERMINING PRESENCE OF A SIGNATURE CONSISTENT WITH A PAIR OF MAJORANA ZERO MODES AND A QUANTUM COMPUTER

(71) Applicant: Microsoft Technology Licensing, LLC, Redmond, WA (US)

(72) Inventors: Lucas Casparis, Copenhagen (DK); Andrew Patrick Higginbotham, Vienna (AT); Esteban Adrian Martinez, Copenhagen (DK)

(73) Assignee: Microsoft Technology Licensing, LLC, Redmond, WA (US)

( * ) Notice: Subject to any disclaimer, the term of this patent is extended or adjusted under 35 U.S.C. 154(b) by 1009 days.

(21) Appl. No.: 17/634,233

(22) PCT Filed: Aug. 11, 2020

(86) PCT No.: PCT/US2020/045791
§ 371 (c)(1),
(2) Date: Feb. 9, 2022

(87) PCT Pub. No.: WO2021/030363
PCT Pub. Date: Feb. 18, 2021

(65) Prior Publication Data
US 2022/0277216 A1　　Sep. 1, 2022

Related U.S. Application Data

(60) Provisional application No. 62/885,715, filed on Aug. 12, 2019.

(51) Int. Cl.
*G06N 10/40*　　(2022.01)
*B82Y 10/00*　　(2011.01)
*H10N 60/80*　　(2023.01)

(52) U.S. Cl.
CPC ............. *G06N 10/40* (2022.01); *H10N 60/80* (2023.02); *B82Y 10/00* (2013.01)

(58) Field of Classification Search
CPC ........ G06N 10/40; H10N 60/80; B82Y 10/00; H04L 9/0852
See application file for complete search history.

(56) References Cited

U.S. PATENT DOCUMENTS 10,558,207 B1 *　2/2020　McGuirk ........... G05B 23/0283
2014/0289227 A1 *　9/2014　Ahmad ................. G06F 16/285
　　　　　　　　　　　　　707/722

OTHER PUBLICATIONS

Ippoliti et al., "Quantum memories with zero-energy Majorana modes and experimental constraints," arXiv:1511.06592v2, 19 pp. (Year: 2016).*

(Continued)

*Primary Examiner* — KC Chen
(74) *Attorney, Agent, or Firm* — Klarquist Sparkman, LLP

(57) ABSTRACT

At a first terminal of a structure capable of hosting Majorana Zero Modes, a first set of data points measuring conductance between the first terminal and a middle terminal of the structure is obtained for different values of bias voltage at the first terminal and at least one other parameter. At a second terminal of the structure, a second set of data points measuring conductance between the second terminal and the middle terminal is obtained for different values of bias voltage at the second terminal and of the at least one other parameter. A measure of mutual information is obtained between the first and second data sets. It is determined whether a signature consistent with a pair of Majorana Zero Modes is present in the structure based on the measure of mutual information. The method may be carried out by a quantum computer.

19 Claims, 6 Drawing Sheets

901 Obtain a first set of data points measuring conductance between a first terminal and a middle terminal of a structure 902 Obtain a second set of data points measuring conductance between a second terminal and the middle terminal of the structure 903 Obtain a measure of mutual information between the first and second data sets 904 Determine whether a signature consistent with a pair of Majorana Zero Modes is present in the structure based on the measure of mutual information

(56) References Cited

OTHER PUBLICATIONS

Lai, Yi-Hua, Jay D. Sau, and Sankar Das Sarma. "Presence versus absence of end-to-end nonlocal conductance correlations in Majorana nanowires: Majorana bound states versus Andreev bound states." Physical Review B 100.4 (Jul. 3, 2019): 045302. (Year : 2019).*
Communication pursuant to Article 94(3) EPC received for European Application No. 20761683.0, mailed on Nov. 30, 2023, 6 Pages.
Albrecht et al., "Exponential Protection of Zero Modes in Majorana Islands," Nature, vol. 531, No. 7593, 14 pp. (Mar. 2016).
Altland et al., "Novel Symmetry Classes in Mesoscopic Normalconducting-Superconducting Hybrid Structures," Physical Review B, vol. 55, No. 2, 20 pp. (Jan. 1997).
Aseev et al., "Selectivity Map for Molecular Beam Epitaxy of Advanced III-V Quantum Nanowire Networks," Nano Letters, vol. 19, pp. 218-227 (Dec. 2018).
Beenakker, "Random-matrix theory of Majorana fermions and topological superconductors," Review of Modern Physics, vol. 87, No. 3, 33 pp. (Sep. 2015).
Casparis et al., "Superconducting Gatemon Qubit based on a Proximitized Two-Dimensional Electron Gas," Nature Nanotechnology, vol. 13, No. 10, 6 pp. (Jul. 2018).
Chang et al., "Hard Gap in Epitaxial Semiconductor-Superconductor Nanowires," Nature Nanotechnology, vol. 10, No. 3, 10 pp. (Jan. 2015).
Churchill et al., "Superconductor-Nanowire Devices from Tunneling to the Multichannel Regime: Zero-Bias Oscillations and Magnetoconductance Crossover," Physical Review B, vol. 87, No. 24, 5 pp (Jun. 2013).
Cifuentes et al., "Manipulating Majorana zero modes in double quantum dots," arXiv: 1905.09140, 14 pp. (Aug. 2019).
Darbellay et al., "Estimation of the Information by an Adaptive Partitioning of the Observation Space," IEEE Trans. on Information Theory, vol. 45, No. 4, pp. 1315-1321 (May 1999).
Das et al., "Evidence of Majorana fermions in an Al-InAs nanowire topological superconductor," arXiv:1205.7073, 36 pp. (May 2012).
Das Sarma et al., "Splitting of the Zero-Bias Conductance Peak as Smoking Gun Evidence for the Existence of the Majorana Mode in a Superconductor-Semiconductor Nanowire," Physical Review B, vol. 86, No. 22, pp. 5 (Dec. 2012).
Deng et al., "Majorana bound states in a coupled quantum-dot hybrid-nanowire system," Science, vol. 354, No. 6319, 21 pp. (Dec. 2016).
Deng et al., "Nonlocality of Majorana Modes in Hybrid Nanowires," Physical Review B, vol. 98, No. 8, 10 pp. (Aug. 2018).
Fregoso et al., "Electrical detection of topological quantum phase transitions in disordered Majorana nanowires," Physical Review B, vol. 88, No. 18, 11 pp. (Nov. 2013).
Hofstetter et al., "Cooper pair splitter realized in a two-quantum-dot Y-junction," Nature, vol. 461, No. 7266, pp. 960-963 (Oct. 2009).
International Search Report and Written Opinion dated Nov. 6, 2020 from International Patent Application No. PCT/US2020/045791, 14 pp.
Karzig et al., "Scalable designs for quasiparticle-poisoning-protected topological quantum computation with Majorana zero modes," Physical Review B, vol. 95, No. 23, 32 pp. (Jun. 2017).
Kells et al., "Near-zero-energy end states in topologically trivial spin-orbit coupled superconducting nanowires with a smooth confinement," Physical Review B, vol. 86, No. 10, 5 pp. (Sep. 2016).
Kitaev, "Fault-tolerant quantum computation by anyons," Annals of Physics, vol. 303, No. 1, pp. 2-30 (Jan. 2003).
Kitaev, "Unpaired Majorana fermions in quantum wires," Physics_Uspekhi, vol. 44, pp. 131-136 (Oct. 2001).
Kraskov et al., "Estimating mutual information," Physical Review E, vol. 69, No. 6, 16 pp. (Jun. 2004).
Krogstrup et al., "Epitaxy of semiconductor-superconductor nanowires," Nature Materials, vol. 14, pp. 400-406 (Jan. 2015).

Lai et al., "Presence versus absence of end-to-end nonlocal conductance correlations in Majorana nanowires: Majorana bound states versus Andreev bound states," arXiv:1901.02655v2, 18 pp. (Jul. 2019).
Larsen et al., "A Semiconductor Nanowire-Based Superconducting Qubit," Physical Review Letters, vol. 115, No. 12, 5 pp. (Sep. 2015).
Lee et al., "Selective-Area Chemical Beam Epitaxy of In-Plane InAs One-Dimensional Channels Grown on InP(001) and InP(111)B Surfaces," arXiv:1808.04563v1, 15 pp. (Aug. 2018).
Lee et al., "Spin-resolved Andreev levels and parity crossings in hybrid superconductor-semiconductor nanostructures," Nature Nanotechnology, vol. 9, 16 pp. (Jan. 2014).
Liu et al., "Andreev bound states versus Majorana bound states in quantum dot-nanowire-superconductor hybrid structures: Trivial versus topological zero-bias conductance peaks," Physical Review B, vol. 96, No. 7, 30 pp. (Aug. 2017).
Lutchyn et al., "Majorana Fermions and a Topological Phase Transition in Semiconductor-Superconductor Heterostructures," Physical Review Letters, vol. 105, No. 7, 5 pp. (Aug. 2010).
Lutchyn et al., "Realizing Majorana zero modes in superconductor-semiconductor heterostructures," arXiv: 1707.04899, 20 pp. (Feb. 2018).
Ménard et al., "Conductance-matrix symmetries of a three-terminal hybrid device," arXiv:1905.05505v1, 8 pp. (May 2019).
Meyer et al., "Non-trivial Chern numbers in three-terminal Josephson junctions," Physical Review Letters, vol. 119, No. 13, 5 pp. (Sep. 2017).
Mourik et al., "Signatures of Majorana fermions in hybrid superconductor-semiconductor nanowire devices," Science, vol. 336, No. 6084, 28 pp. (May 2012).
Nayak et al., "Non-Abelian Anyons and Topological Quantum Computation," Reviews of Modern Physics, vol. 80, No. 3, 73 pp. (Sep. 2008).
Oreg et al., "Helical liquids and Majorana bound states in quantum wires," Physical Review Letters, vol. 105, No. 17, 5 pp. (Oct. 2010).
Pankratova et al., "The multi-terminal Josephson effect," arXiv:1812.06017v1, 7 pp. (Dec. 2018).
Pedregosa et al., "Scikit-learn: Machine Learning in Python," Journal of Machine Learning Research, vol. 12, pp. 2825-2830 (Oct. 2011).
Plugge et al., "Majorana box qubits," New Journal of Physics, vol. 19, 15 pp. (Jan. 2017).
Reeg et al., "Zero-energy Andreev bound states from quantum dots in proximitized Rashba nanowires," Physical Review B, vol. 98, No. 24, 13 pp. (Dec. 2018).
Rosdahl et al., "The Andreev rectifier: a nonlocal conductance signature of topological phase transitions," Physical Review B, vol. 97, No. 4, 12 pp. (Jan. 2018).
Stanescu et al., "Non-locality of zero-bias anomalies in the topologically-trivial phase of Majorana wires," Physical Review B, vol. 89, No. 22, 5 pp. (Jun. 2014).
Strambini et al., "The ω-SQUIPT: phase-engineering of Josephson topological materials," Nature Nanotechnology, 10 pp. (Sep. 2016).
Vaitiekėnas et al., "Selective Area Grown Semiconductor-Superconductor Hybrids: A Basis for Topological Networks," Physical Review Letters, vol. 121, No. 14, 8 pp. (Oct. 2018).
Van Heck et al., "Single fermion manipulation via superconducting phase differences in multiterminal Josephson junctions," Physical Review B, vol. 90, No. 15, 10 pp. (Oct. 2014).
Vinh et al., "Information Theoretic Measures for Clusterings Comparison: Is a Correction for Chance Necessary?," Proc. Int'l Conf. on Machine Learning, pp. 1073-1080 (Jun. 2009).
Vuik et al., "Reproducing topological properties with quasi-Majorana states," arXiv:1806.02801v1, 12 pp. (Jun. 2018).
Whiticar et al., "Interferometry and coherent single-electron transport through hybrid superconductor-semiconductor Coulomb islands," arXiv:1902.07085v1, 11 pp. (Feb. 2019).
Xie et al., "Topological Andreev bands in three-terminal Josephson junctions," Physical Review B, vol. 96, No. 16, 5 pp. (Oct. 2017).
Yang et al., "Evidence of Majorana Zero Modes in Josephson Trijunctions," arXiv: 1904.02677, 25 pp. (Apr. 2019).
Zhang et al., "Quantized Majorana conductance," Nature, vol. 556, No. 7699, 14 pp. (Apr. 2018).

(56)　　　　　References Cited

OTHER PUBLICATIONS

Anselmetti, et al., "End-to-end correlated subgap states in hybrid nanowires", Retrieved from: https://arxiv.org/abs/1908.05549, Sep. 17, 2019, 10 Pages.

International Preliminary Report on Patentability Issued in PCT Application No. PCT/US20/045791, Mailed on Feb. 24, 2022, 08 Pages.

Communication pursuant to Article 94(3) EPC received for European Application No. 20761683.0, mailed on Aug. 14, 2025, 8 Pages.

* cited by examiner

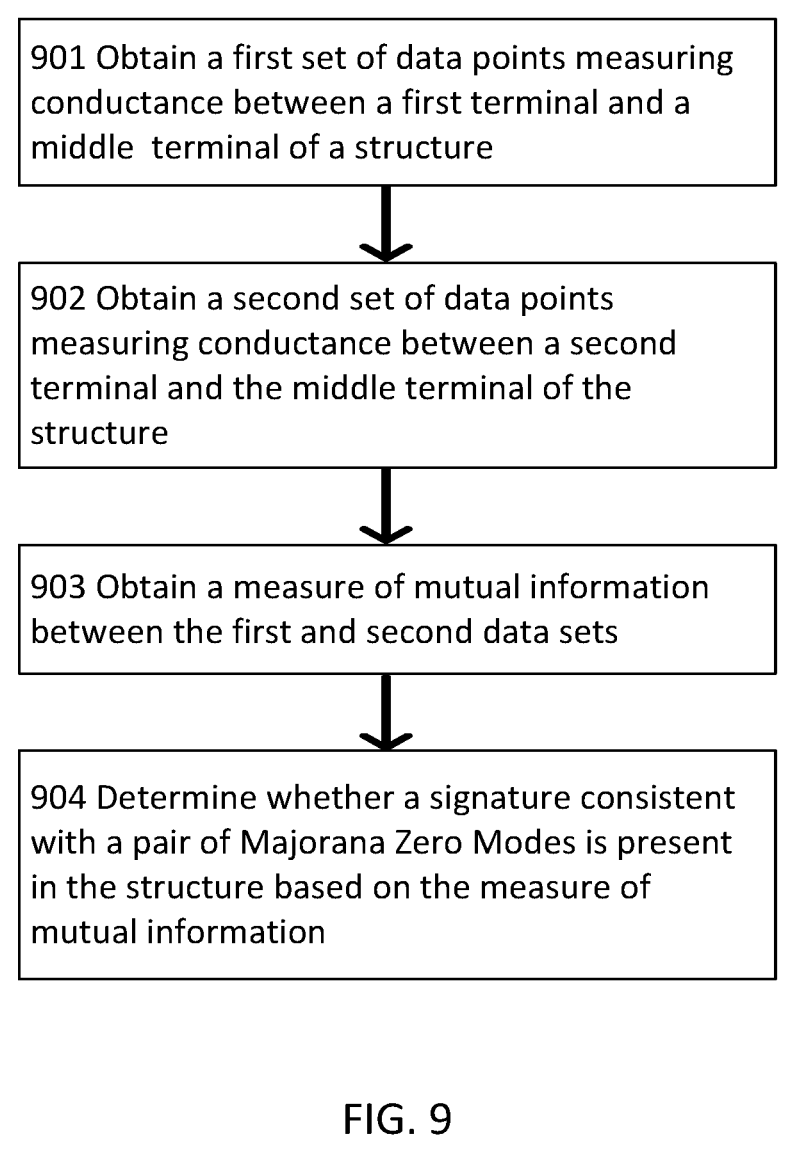

901 Obtain a first set of data points measuring conductance between a first terminal and a middle terminal of a structure 902 Obtain a second set of data points measuring conductance between a second terminal and the middle terminal of the structure 903 Obtain a measure of mutual information between the first and second data sets 904 Determine whether a signature consistent with a pair of Majorana Zero Modes is present in the structure based on the measure of mutual information

FIG. 9

METHOD FOR DETERMINING PRESENCE OF A SIGNATURE CONSISTENT WITH A PAIR OF MAJORANA ZERO MODES AND A QUANTUM COMPUTER

CROSS REFERENCE TO RELATED APPLICATION

This application is the U.S. National Stage of International Application No. PCT/US2020/045791, filed on Aug. 11, 2020, which was published in English under PCT Article 21(2), which in turn claims the benefit of U.S. Provisional Application No. 62/885,715, filed on Aug. 12, 2019, which is incorporated herein by reference in its entirety.

TECHNICAL FIELD

The present disclosure relates to a method for determining whether a signature consistent with a pair of Majorana Zero Modes is present in a structure and to a quantum computer which carries out the method.

BACKGROUND

Quantum computing is a class of computing in which inherently quantum mechanical phenomena, such as quantum state superposition and entanglement, are harnessed to perform certain computations far more quickly than any classical computer could ever be capable of. In a "topological" quantum computer, calculations are performed by manipulating certain quasiparticles that occur in certain physical systems.

The quasiparticles proposed for use in a topological quantum computer are so-called "anyons". Anyons have unique characteristics that distinguish them from both fermions and bosons. Moreover, in a topological quantum computer, the anyons should be non-abelian, rather than abelian, as this permits multiple distinct states of the system to have the same configuration of particles. It is these properties of non-abelian anyons that serve as a basis for topological quantum computing, in which information is encoded as a topological property of non-abelian anyons, specifically the braiding of their space-time worldlines. This has certain benefits over other models of quantum computation. One key benefit is stability, as the quantum braiding is unaffected by perturbations on a scale that could cause error-inducing quantum decoherence in other types of quantum computer.

Broadly speaking, to date, two types of physical system have been considered as potential hosts of non-abelian anyons, namely "5/2 fractional quantum Hall" systems and (more recently) superconductor (SU) materials and semiconductor-superconductor (SE/SU) heterostructures, including in particular nanowires. With regard to SE/SU heterostructures, a key advance in the field was the realization that non-abelian anyons in the form of "Majorana zero modes" (MZMs) can be formed in regions of semiconductor (SE) coupled to a superconductor (SU). Based on this phenomenon, a small network of for example SE/SU nanowires can be used to create a quantum bit, wherein each SE/SU nanowire comprises a length of semiconductor coated with a superconductor.

A quantum bit or "qubit" is an element upon which a measurement with two possible outcomes can be performed, but which at any given time (when not being measured) can in fact be in a quantum superposition of the two states corresponding to the different outcomes.

A "topological" qubit is a qubit implemented based on the above-mentioned use of non-abelian anyons in the form of MZMs. A non-abelian anyon is a type of quasiparticle, meaning not a real particle as such but an excitation in an electron liquid that behaves at least partially like a particle. Particularly, an anyon is a quasiparticle occurring in a two-dimensional system (which has two degrees of freedom in space). A Majorana zero mode (MZM) is a particular bound state of such quasiparticles. Under certain conditions, these states or modes can be formed close to the semiconductor/superconductor interface in an SE/SU nanowire or other structure, in a manner that enables them to be manipulated as quantum bits for the purpose of quantum computing. Regions or "segments" of the nanowire or other structure between the MZMs are said to be in the "topological" regime.

Majorana zero modes appear in pairs, with each member (or "mode" or "excitation") of the pair appearing at different physical locations, for example at the respective ends of linear parts of the topological segment (such as a nanowire). In the ideal theoretical situation, the two members (excitations) of a pair of MZMs are perfectly correlated. However, in practice in real devices, the two members of a pair of MZMs are not perfectly correlated because of for example impurities in the materials used to form the devices and/or other practical constraints.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Nor is the claimed subject matter limited to implementations that solve any or all of the disadvantages noted herein.

According to an aspect disclosed herein, there is provided method comprising:

at a first terminal of a structure capable of hosting Majorana Zero Modes, obtaining a first set of data points measuring conductance between the first terminal and a middle terminal of the structure for different values of bias voltage at the first terminal and at least one other parameter;

at a second terminal of the structure, obtaining a second set of data points measuring conductance between the second terminal and the middle terminal for different values of bias voltage at the second terminal and of the at least one other parameter;

obtaining a measure of mutual information between the first and second data sets; and determining whether a signature consistent with a pair of Majorana Zero Modes is present in the structure based on the measure of mutual information.

Examples of the method can be carried out requiring minimal or, in some cases, no manual input (for various parameters, for example). This makes the method less labor-intensive and subjective than some known methods, and can enable the method to be carried out substantially or practically automatically. The method is also platform-independent, since it does not rely on particular peak shapes or amplitudes. The method may be implemented for testing of the structure. The method may be implemented during operation of a quantum computer that utilizes the structure, for example to control certain operating parameters of the quantum computer.

It may be noted that, in an example, the first set of data points may be obtained for the conductance between the first terminal and the middle terminal for different values of bias voltage at the first terminal, then the second set of data points may be obtained for the conductance between the second terminal and the middle terminal for different values of bias voltage at the second terminal, in each case with the same value for the at least one other parameter, and then the measurements for the first and second conductances are repeated for different values of the at least one other parameter.

In an example, it is determined that a signature consistent with pair of Majorana Zero Modes is present in the structure if the measure of mutual information exceeds a threshold.

In an example, the threshold comprises a certain number of standard deviations of the mutual information.

In an example, the threshold comprises an absolute value of the measure of mutual information.

A suitable value for the number of standard deviations or the absolute value of the mutual information, respectively, may be determined by experiment.

In an example, the measure of the mutual information comprises a normalized mutual information.

In an example, the measure of the mutual information comprises a normalized pointwise mutual information.

In an example, the measure of mutual information between the first and second data sets is obtained by adaptively binning the first set of data points and the second set of data points. This can help to make the method more robust. In an example, the size of the bins for the data is reduced until a bin contains less than a predetermined number of data points.

In an example, the structure comprises a semiconductor-superconductor heterostructure. In an example, the semiconductor-superconductor heterostructure comprises a nanowire, the first terminal being at a first end of the nanowire and the second terminal being at a second end of the nanowire.

In another example, the structure comprises a topological insulator.

In an example, the at least one other parameter comprises a voltage applied to the middle terminal.

In an example, the at least one other parameter comprises the intensity of a magnetic field applied to the structure.

In an example, the method comprises, subsequent to the determining, adjusting one or more voltages or intensity of a magnetic field applied to the structure based on the measure of mutual information so as to increase the likelihood that a pair of Majorana Zero Modes is present in the structure.

There may also be provided a quantum computer, the quantum computer being arranged to carry out a method as described above.

BRIEF DESCRIPTION OF THE DRAWINGS

To assist understanding of the present disclosure and to show how embodiments may be put into effect, reference is made by way of example to the accompanying drawings in which:

FIG. 9 shows a schematic flow diagram of an example of a method as described herein.

DETAILED DESCRIPTION

As mentioned, Majorana zero modes (MZMs) appear in pairs, with each member (or "mode" or "excitation") of the pair appearing at different physical locations. Such locations may be for example at the respective ends of linear parts of a topological segment (such as a nanowire). In the ideal theoretical situation, the two members (modes or excitations) of a pair of MZMs are perfectly correlated (as a function of control parameters). However, in practice in real devices, the two members of a pair of MZMs are not perfectly correlated because of for example impurities in the materials used to form the devices and/or other practical constraints.

In a little more detail, single Majorana bound states emerge at each end of a structure, such as a one-dimensional topological superconductor (such as a nanowire), and pairs of Majorana bound states have been proposed to non-locally encode quantum information. Following the theoretical suggestion that hybrid superconductor-semiconductor nanowires can possess a topological phase, bound states within the superconducting gap (sub-gap states) have been studied using the tunneling-conductance from a single wire end, and the results are broadly consistent with Majorana zero modes.

It has also been discovered, both in experiment and theory, that localized non-topological or quasi-Majorana bound states can mimic many signatures of well-separated Majorana bound states. Further, quantum-dot experiments have been used to gain information on the spatial extent of sub-gap states. It is desirable to be able to distinguish Majorana zero modes from such local states to confirm that Majorana zero modes are present and so are suitable for quantum computing.

Probing both ends of the nanowire or other structure has been proposed to distinguish local states from Majorana zero modes by revealing end-to-end correlations between the members of the Majorana pairs and revealing bulk signatures of the topological transition. However, known techniques for doing this, including for example independent tunneling spectroscopy of both wire ends, are difficult or impractical or not relevant for a quantum computer as such techniques only consider one end of the device at a time (whereas Majorana zero modes appear as pairs).

Examples described herein allow correlations between the members of a (putative) Majorana zero mode pair to be measured and quantified, enabling a determination to be made as to whether the members can be properly regarded as an MZM pair. This can be carried out during an initial set-up stage for a quantum computer when the quantum computer is being built and commissioned, and/or this can be carried out during operation of the quantum computer, to enable at least some of the operating parameters of the quantum computer (such as control or operating voltages) to be set and maintained. This can be used to increase the likelihood that a pair of Majorana Zero Modes is present in the device.

Figure 1:
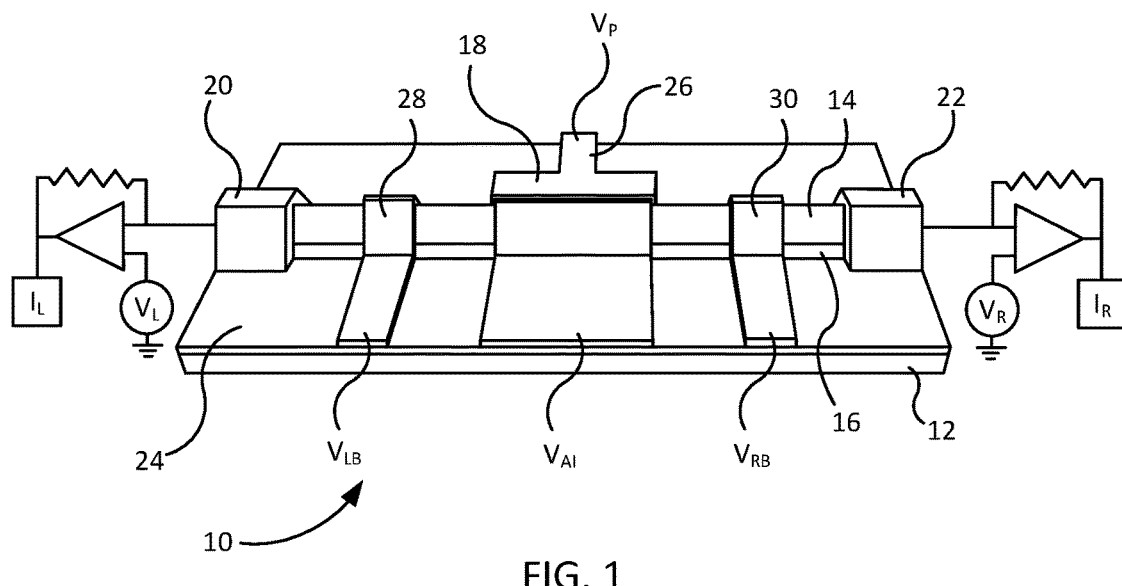
FIG. 1 shows schematically an example of a device having a semiconductor-superconductor heterostructure.

Referring now to FIG. 1, this shows schematically an example of a structure 10 capable of hosting Majorana Zero Modes. In this example, the structure 10 is a device 10 having a semiconductor-superconductor (SE/SU) heterostructure. In this example, the device 10 is in the form of (that is, includes) a "nanowire". In other examples, the structure 10 may have a different configuration, and may be for example a topological insulator. Furthermore, whilst examples of specific materials for the device 10 will be given, other materials may be used in other examples.

The device 10 of this example may be formed generally in accordance with the techniques described in "Selective-area chemical beam epitaxy of in-plane InAs one-dimensional channels grown on InP(001), InP(111)B, and InP(110) surfaces" by Joon Sue Lee et al (arXiv:1808.04563, 2018), the entire content of which is incorporated herein by reference. In brief, the device 10 of this example has an InP substrate 12. A nanowire 14 of InAs is formed on the substrate 12, by for example chemical beam epitaxy. A buffer layer 16, in this example formed of graded InAsP, is formed between the nanowire 14 and the substrate 12. Epitaxial Al is deposited in situ immediately after semiconductor growth. The Al is then selectively removed from the substrate 12 and the ends of the nanowire 14 by a wet etch. This leaves a central Al lead 18. Ti/Au Ohmic contacts 20, 22 are then deposited at the ends of the nanowire 14. The structure formed so far is then covered by a global HfOx dielectric layer 24. An electrostatic Ti/Au gate 26 is then deposited over the center of the nanowire 14. Electrostatic Ti/Au gates 28, 30 are also deposited over the nanowire 14, respectively located between the central electrostatic Ti/Au gate 26 and the Ti/Au Ohmic contacts 20, 22.

In short, the nanowire 14 provides the semiconductor (formed of InAs in this example) and the Al lead 18 provides the superconductor (when the device 10 is operated at a suitable low temperature) of the semiconductor-superconductor (SE/SU) heterostructure provided by this example device 10. To give an idea of scale, the width of the device 10 shown schematically in FIG. 1 may be between around 300 nm to 900 nm or so. Indeed, in one example for study purposes, the device 10 is made as a "short" device, having a width of 300 nm and in another example, the device 10 is made as a "long" device, having a width of 900 nm.

It is emphasized that the device 10 shown schematically in FIG. 1 and discussed above, and also the specific materials and method of formation discussed above, are just one example, and that aspects of the present disclosure may be applied to other structures, including semiconductor-superconductor (SE/SU) heterostructures, having a different topology and/or formed of different materials.

If the device 10 is operating as desired (for quantum computing) to cause Majorana zero modes (MZMs) to appear, the MZMs appear in pairs, with each member (or "mode" or "excitation") of the pair appearing at different physical locations. In this example, the members of the MZM appear respectively towards the left and right ends of the nanowire 14 (as shown in FIG. 1). In accordance with an example of the present disclosure, the correlation between the respective members of the (putative) MZM pair is measured and then quantified. A determination can then be made as to whether a signature consistent with a pair of Majorana Zero Modes is present in the structure, in turn so that it can be determined whether the members can be properly regarded as members of an MZM pair. In an example, this is carried out by independently measuring the conductance at the left side and at the right side of the nanowire 14 and comparing the results to determine, and preferably obtain a measure of, the correlation between the MZM members.

In an example, the measurement of the conductances is carried out as follows. All measurements were performed in a dilution refrigerator with base electron temperature <100 mK. The magnetic field is fixed at B=0 in an example. This allows identification of end-to-end correlations without reference to the topological regime.

The device 10 has three electrical terminals for electrical measurement, namely the central Al lead 18 and the two Ti/Au Ohmic contacts 20, 22 at the ends of the nanowire 14. The left contact 20 sources a voltage $V_L$ and measures a current $I_L$. Likewise, the right contact 22 sources a voltage $V_R$ and measure a current $I_R$. The third terminal 18 is a middle terminal. The third terminal 18 is formed from the selective etch of the epitaxial Al, and is set to a voltage $V_{Al}$. Because the third terminal 18 is fabricated from a subtractive process after growth in this example, it can be formed without disrupting the fragile Al—InAs interface. Further, voltages VLB and VRB are applied to the left and right electrostatic gates 28, 30 respectively to tune the coupling to the left and right contacts 20, 22. Finally, a "plunger gate" voltage $V_P$ is applied to the central electrostatic gate 26 to tune the electrochemical potential within the nanowire 14. This set-up allows the left conductance $g_L = \delta I_L / \delta(V_L - V_{Al})$ and the right conductance $g_R = \delta I_R / \delta(V_R - V_{Al})$ to be independently measured using lock-in techniques. The voltages are adjusted such that the above-gap conductance, averaged over gate voltage, is <0.15 e²/h.

The right and left conductances $g_R$ and $g_L$ can be measured at different times, based on or using different operating parameters. For example, the right and left conductances $g_R$ and $g_L$ may be measured as a function of bias ($V_L$ and $V_R$) and plunger gate voltage ($V_P$) with $V_{Al}=0$ fixed. In particular, the conductance data may be obtained by sweeping $V_R$ while measuring $g_R$ with $V_L=0$ fixed, and then sweeping $V_L$ while measuring $g_L$ with $V_R=0$ fixed. After these sequential bias sweeps, $V_P$ can be incremented and the process repeated. A comparison of the measured right and left conductances $g_R$ and $g_L$ may then be carried out to determine correlation between the (putative) Majorana modes at the ends of the nanowire 14, and to quantify that correlation, the correlation being a signature of these Majorana modes being present. Alternatively or additionally, the applied magnetic field B may be varied for different measurements in some examples.

In another example, the right and left conductances $g_R$ and $g_L$ are measured simultaneously. For example, the aluminium bias $V_{Al}$ may be swept and the currents on the left and right sides measured simultaneously with $V_R$ and $V_L$ both=0 and, again, the plunger gate voltage $V_P$ can be incremented and the process repeated. Again, the applied magnetic field B may also be varied for different measurements in some examples.

It has been found that, at least in some examples and for at least some of the data, measuring the conductances in sequence or simultaneously leads to the same results. Nevertheless, measuring the conductances simultaneously is generally preferred in the present examples as this provides simultaneous data acquisition on the left and right sides of the nanowire 14.

Figure 2:
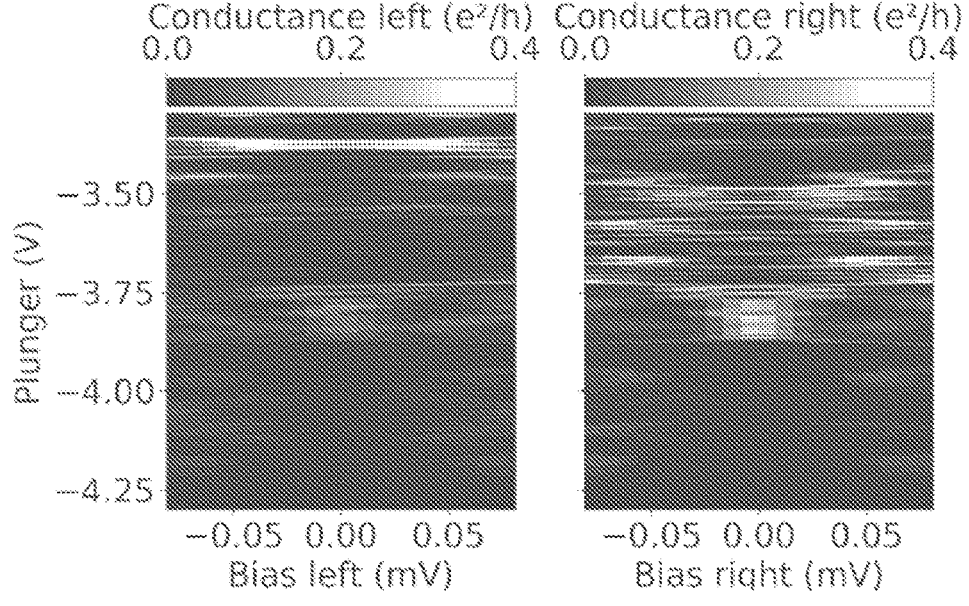
FIG. 2 shows schematically an example of the measured results of left and right conductances of an example of the device of FIG. 1.

FIG. 2 shows schematically the measured results of the left and right conductances $g_L$ and $g_R$ obtained using a bias-plunger scan as described above for the short version of the device 10, with the results of the left conductance being to the left of the figure and the results of the right conductance being to the right of the figure. The x axis shows the bias $V_L$ and $V_R$ respectively (in mV) and the Y axis shows the plunger gate voltage $V_P$ (in V). The intensity of the plot indicates the conductance (in $e^2/h$), with a brighter intensity representing a larger conductance. A correlation between the two conductances can be seen visually in that similar bright spots at similar locations can be seen in the two plots. Particularly noticeable are bright spots (high conductance) centrally in the two plots, where the bias voltages $V_L$ and $V_R$ are both zero (and at the same plunger gate voltage $V_P$). This is indicative that Majorana zero modes are indeed present.

Figure 3:
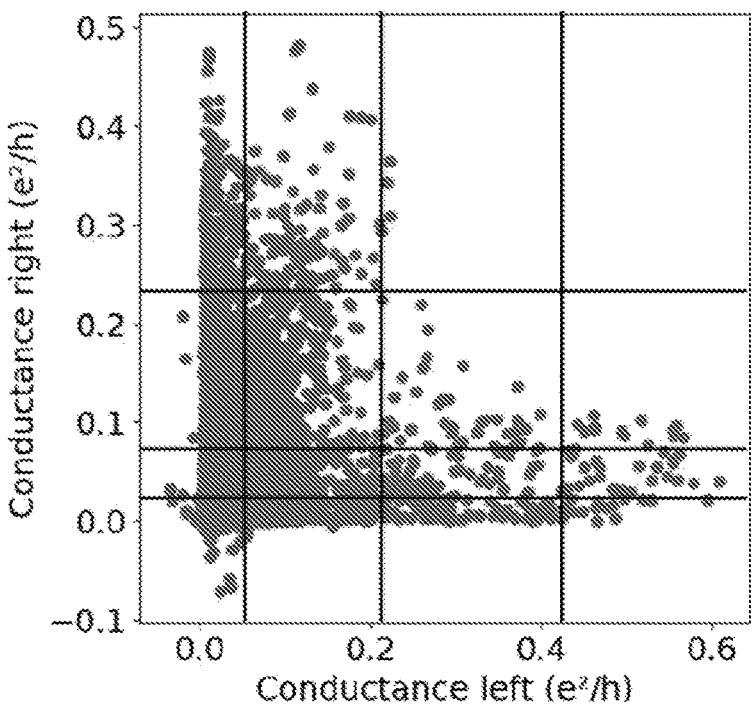
FIG. 3 shows schematically a conductance scatter plot for the example of the measured results of left and right conductances of FIG. 2.

Another way to visualize the data is the conductance scatter plot shown in FIG. 3, which shows the right conductance values v the left conductance values taken at each measurement. Here, it is noted again that the various bias voltages and plunger gate voltage are varied for the different measurements. It is also possible to vary the intensity of the applied magnetic field B for the different measurements in other examples. In a scatter plot like that shown in FIG. 3, an "L" shape would indicate that there is no correlation between the left and right conductances. The fact that the conductance values spread across the plot shown in FIG. 3 indicates that there is (a degree of) correlation between the left and right conductances.

Next, the correlation between the left and right conductances is quantified. For this, a known method first identifies peaks in the values of the conductances, using a peak-finding algorithm, and then apply binary peaks masks to the left and right values of conductance. A cross-covariance between the left and right masks is then calculated, which provides a measure of the correlation. However, a problem with this technique is that the peaks in the data have to be found in the first place. This requires a peak-finding algorithm with input parameters, which are typically user-defined and is therefore a laborious and somewhat heavily manual process. Moreover the "optimal" input parameters are dependent on the data set, which in turn introduces a degree of bias and make this method not very universal.

According to the present disclosure, a different technique to quantify the correlation between the left and right conductances is therefore used. In this respect, it is first noted that the conductances are correlated if they cannot be described by the product of two independent conductance distributions on the left and right sides. In the present example, a statistical measure for how much the joint conductance distribution deviates from independence is given by the "mutual information" (MI) between the left and right conductances. The mutual information of two random variables is a measure of the mutual dependence between the two variables. The mutual information quantifies the "amount of information" obtained about one random variable through observing the other random variable.

The use of the mutual information has a number of advantages. For example, fewer user-defined inputs that depend on the particular data set are required. This makes the process less labor-intensive and less subjective and, indeed, can allow the method to be entirely, or practically entirely, automated. In some examples, the method can be implemented adaptively (using for example adaptive binning, as will be discussed), which makes use of the information within the data itself. This makes the mutual information method more robust.

A number of options for calculating the mutual information in the present context are possible.

In particular, in one example and in overview, the correlation between the left and right conductances is quantified by first obtaining a measure of or estimating the joint conductance probability distribution from the measurements. A number of techniques for this are possible. A particularly useful example for present purposes uses "adaptive binning" which will be discussed further below. The "mutual information" between both conductances is then calculated to quantify (statistically) how much the conductances deviate from independent conductance distributions at both ends of the nanowire 14. The pointwise mutual information measures how much each individually measured conductance pair deviates from independence, which in turn can be used to determine whether a signature consistent with a pair of MZMs is present.

In more detail, in an example the measured conductance values are "binned" to calculate a histogram and a discrete probability distribution $p(g_L, g_R)$ is then estimated. In this, as known per se for "binning" techniques as used in statistical analysis of data, the original measured conductance values that fall in a given small interval (a "bin") are replaced by a value representative of that interval, which is often the central value of the interval.

For the binning of the measured conductance values, it is possible to use bin sizes that are fixed. However, it has been found that the density of points changes by orders of magnitude in different regions of the conductance space. This can be seen qualitatively in FIG. 3, which shows that many points have a low conductance and that few points have a large conductance.

Accordingly, in an example, an adaptive binning technique may be used. An example of an adaptive binning technique per se is disclosed in "Estimation of the Information by an Adaptive Partitioning of the Observation Space" by Georges A. Darbellay and Igor Vajda, IEEE Transactions on Information Theory, Vol. 45, No. 4, May 1999 1315, the entire content of which is incorporated herein by reference. Following this technique in the present example, the sample space is recursively divided into rectangular bins with an (approximately or sometimes exactly) equal number of points. As a criterion for continuing the subdivision of a bin, there may be a minimum number of points in the bin. For the present example, the subdivision of the bins is stopped for bins with fewer than 80 points. This yields an average of 36 points per bin for the final subdivision in the present example.

The end result of this adaptive binning is a grid of M rectangles of size $A_i \times B_i$. The probability density $p(A_i \times B_i)$ in each bin i is then estimated as the number of samples (i.e. the number of samples measured conductance values) in the bin divided by the total number of samples (i.e., again, the total number of the measured conductance values).

In an example, the mutual information MI is then calculated as follows. The contribution of each bin in the sample space to the mutual information MI is known as the pointwise mutual information (PMI) and is given by:

$$PMI = \log\left(\frac{p(A_i \times B_i)}{p(A_i \times \mathbb{R})p(\mathbb{R} \times B_i)}\right) \qquad \text{Eq. 1}$$

where $p(A_i \times \mathbb{R})$ is the probability density in the rectangle projected onto the left conductance axis and $p(\mathbb{R} \times B_i)$ is the probability density in the rectangle projected onto the right conductance axis. Following tis example, the mutual information MI is the expected value of the pointwise mutual information over the entire distribution and can be calculated as:

$$MI = \sum_{i=1}^{M} p(A_i \times B_i)\log\left(\frac{p(A_i \times B_i)}{p(A_i \times \mathbb{R})p(\mathbb{R} \times B_i)}\right) \qquad \text{Eq. 2}$$

In this regard, in general for independent variables a and b, one expects P(a,b)=P(a)P(b). Deviations from this relationship can be quantified by the normalized mutual information NMI, which, here, is calculated as a function of bias and plunger or middle terminal voltage shift between the left and right datasets, i.e. NMI=NMI($\delta$V, $\delta$V$_P$). In this regard, the normalized mutual information NMI lies in the range [0,1] and is given in an example by:

$$NMI = \frac{MI}{H} \qquad \text{Eq. 3}$$

where H is the Shannon entropy of the joint probability distribution which is given by:

$$H = \Sigma_{i=1}^{M} p(A_i \times B_i)\log(p(A_i \times B_i)) \qquad \text{Eq. 4}$$

Other normalization techniques may be used.

Instead of using adaptive binning of the conductance values, a number of alternatives for calculating the mutual information MI are possible.

For example in one alternative, joint distributions P($g_R$, $g_L$) and marginal distributions P($g_R$) and P($g_L$) are estimated from the scatter-plot data of the right and left conductances $g_R$ and $g_L$(see FIG. 3). The mutual information MI can then be calculated as:

$$MI = \sum_{g_L} \sum_{g_R} p(g_L, g_R)\log\left(\frac{p(g_L, g_R)}{p(g_L)p(g_R)}\right) \qquad \text{Eq. 5}$$

Again, the mutual information MI may be normalized to give the normalized mutual information NMI which is equivalent to the dual total correlation and lies in the range [0,1]. The normalized mutual information NMI may be obtained by dividing the mutual information NMI by the Shannon entropy, as discussed for the example above. Again, other normalization techniques may be used.

In any of the examples, the normalized pointwise mutual information NPMI may be calculated to provide a more "granular" view of the conductance correlations. In particular, whereas the normalized mutual information NMI is a property of the entire distribution, the normalized pointwise mutual information NPMI is associated with individual ($g_R$, $g_L$) pairs. The normalized pointwise mutual information NPMI can therefore be mapped as a function of the measurement parameters (including for example bias (V$_L$ and V$_R$) and plunger gate voltage (V$_P$)). The normalized pointwise mutual information NPMI may be calculated as:

$$NPMI = \frac{PMI}{H} \qquad \text{Eq. 6}$$

where again H is the Shannon entropy of the joint probability distribution which is given in equation 4 above.

Figure 4:
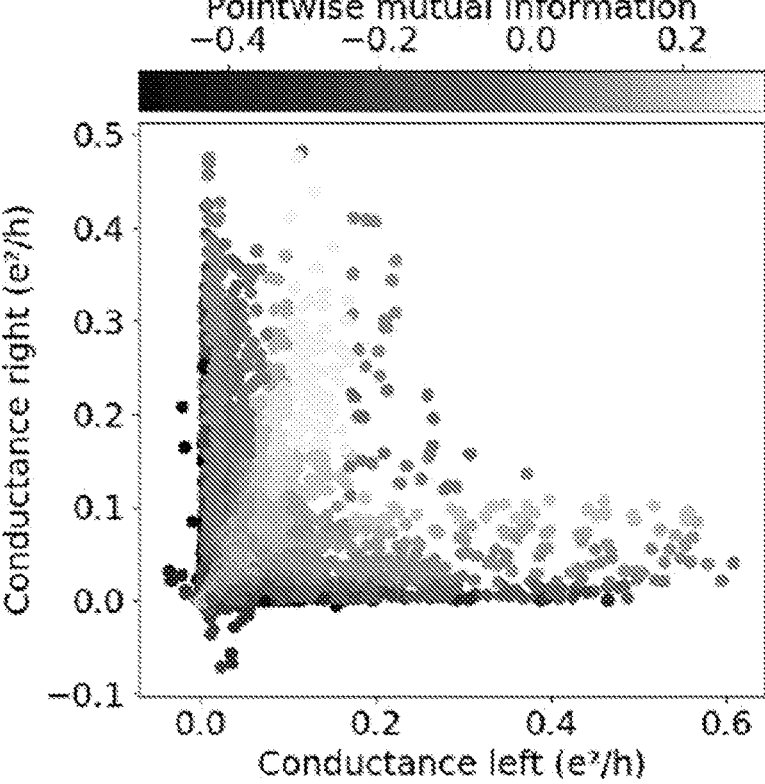
FIG. 4 shows schematically the conductance scatter plot of FIG. 3 with the value of the pointwise mutual information indicated by brightness.

Following the example of the conductance scatter plot shown in FIG. 3, FIG. 4 shows the same plot but with the value of the pointwise mutual information PMI for each of the conductance points indicated by shading, in which a brighter intensity represents a larger PMI for the individual points.

Figure 5:
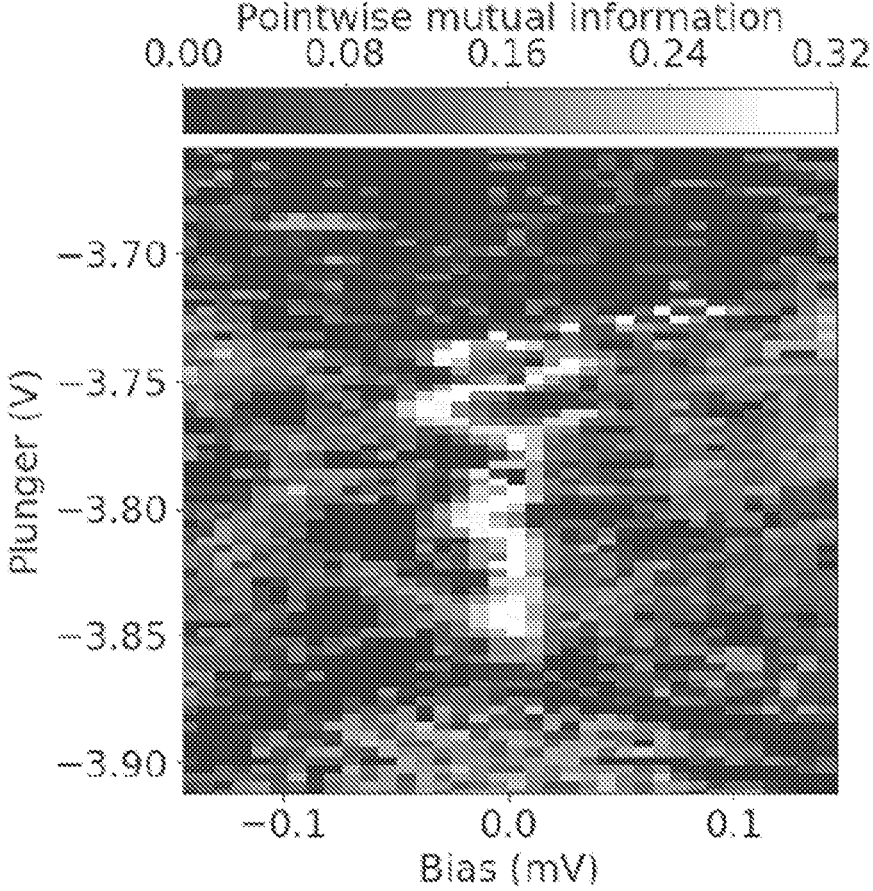
FIGS. 5 and 6 show schematically the value of the pointwise mutual information mapped back to results of left and right conductances for first and second examples of the device respectively.

Further, the values of the pointwise mutual information PMI for the measured conductance points can be mapped back to the values obtained for the conductances in the initial measurement scanning. An example of this is shown in FIG. 5, which corresponds to the measured results of the left and right conductances $g_L$ and $g_R$ obtained using a bias-plunger scan as described above for the short version of the device 10 and shown in FIG. 2, though somewhat "zoomed in" to show detail better. In FIG. 5, again a brighter intensity represents a larger PMI for the individual points. This shows graphically regions of high PMI which correspond to correlated states. In the parameter regime where the device can host Majorana zero modes, these correlated states are a signature of these Majorana modes.

Figure 6:
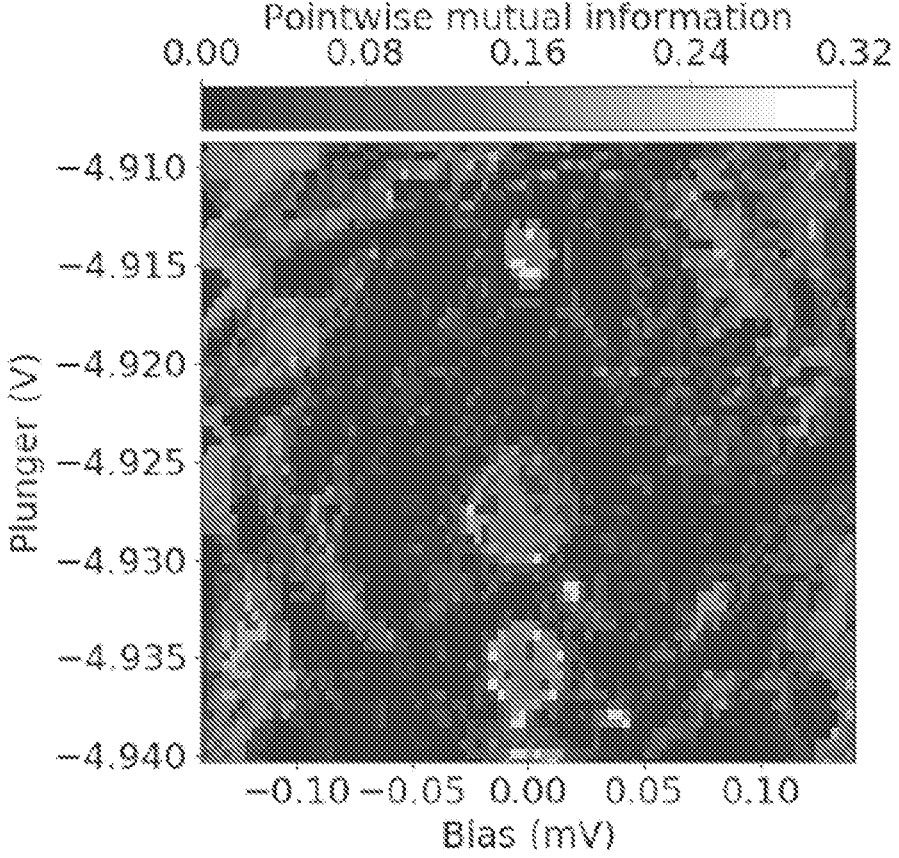

For comparison, FIG. 6 shows the mapping of the PMI values for the measured conductance points for the long version of the device 10 and corresponding to FIG. 5 (which is for the short version of the device 10, as mentioned). As can be seen, in general the values of the PMI for the long version of the device 10 are relatively lower (less bright in FIG. 6) than for the short version of the device 10, indicating that the correlation between the bound states in the long version of the device 10 is somewhat less than for the short version of the device 10. There is nevertheless some structure shown, which indicates the presence of some correlations, which are weaker than in the short device.

The above examples rely on techniques using histograms and binning of the data points, including in a particular example adaptive binning of the data points. As noted, the use of the pointwise mutual information in particular provides for easy visualization of the presence of Majorana bound states and enables a more or fully automated testing and control method. One drawback of the use of binning of the data points is the dependence of the calculated mutual information on the details of the binning. An alternative method for estimating the mutual information of the measured distribution is a non-parametric estimator. An example of such a method as such is described in "Estimating Mutual Information" by A. Kraskov at al (arXiv:0305641, 2004), the entire content of which is incorporated herein by reference. This method relies only on the nearest-neighbor distances for estimating the mutual information.

In any event, whichever way the mutual information is calculated, it has been found that quantifying conductance correlations in a structure capable of hosting Majorana Zero Modes, such as for example a semiconductor-superconductor (SE/SU) heterostructure, using the mutual information has the advantages that it requires minimal analysis of the data and explicitly tests for correlations in the conductance values of all data points.

Figure 7:
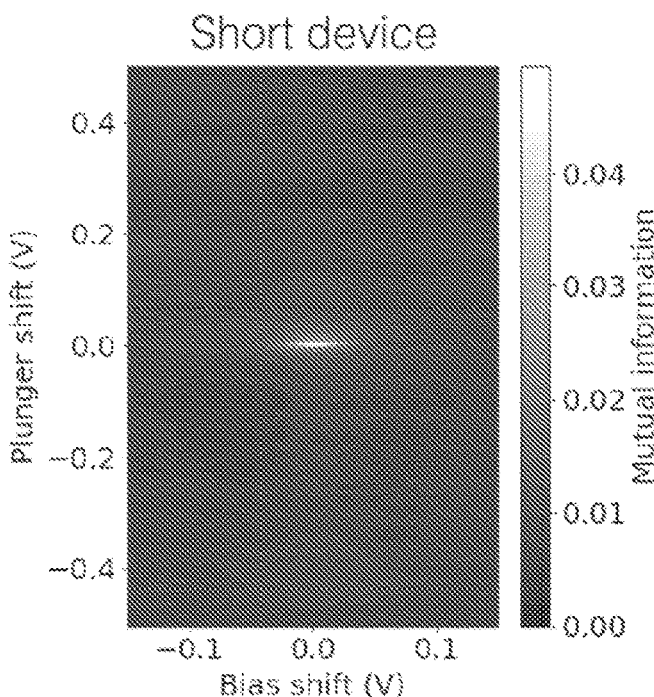
FIGS. 7 and 8 show schematically the values of the mutual information that are obtained at different values of voltages for first and second examples of the device respectively.
Figure 8:
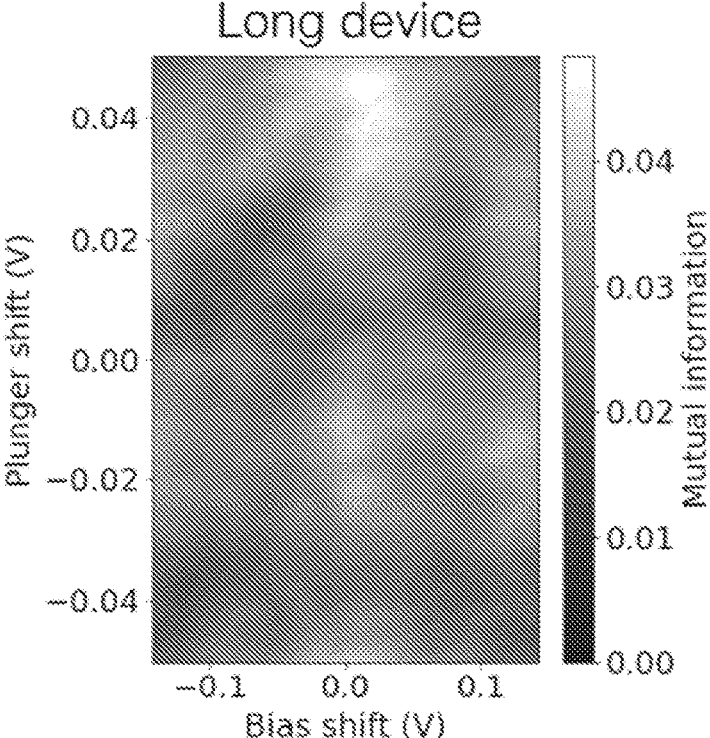

It is instructive also to consider the values of the mutual information that are obtained at different values of the bias (V$_L$ and V$_R$) and plunger gate voltage (V$_P$) that are applied, in particular as the bias and plunger gate voltages are shifted. The results for the short version and the long version of the device 10 are shown in FIGS. 7 and 8 respectively in which the value of the mutual information MI at different bias and plunger gate voltages is indicated by shading, in which a brighter intensity represents a larger MI. As can be seen in FIG. 7, for the short version of the device 10 there is a distinct localized bright spot (indicating a high MI) around values of zero for the shift in voltages applied to the bias and the plunger gate and dark spots, and the plot is generally dark elsewhere (indicating a low MI). This is a strong indicator that strong non-trivial correlations exist, which are a signature of Majorana zero modes in the correct physical regime. In contrast as can be seen in FIG. 8, for the long version of the device 10 there is still a central bright spot but this is less bright (again, indicating a high MI, though not as high as for the short version of the device 10). Moreover, there are a number of bright spots (though again, less bright than for the short version) which are spread over the values of the bias and plunger voltage shifts.

To quantify the correlations between the members of a (putative) Majorana zero mode pair (i.e. to obtain a measure of whether the members of the (putative) Majorana zero mode pair can be regarded as suitable for use in a quantum computer), a number of options are available. In one example, the amount of variation of the mutual information is used for this purpose. For example, the standard deviation $\sigma$ of the mutual information may be used to quantify the amount of variation of the obtained values of the mutual information. Suitable experiments may be used to determine a threshold in the variation such that variations above that threshold should be regarded as indicating the presence of a Majorana zero mode pair. For example and without limitation, the threshold may be $2\sigma$ (i.e. one standard deviation either side of the mean), $4\sigma$ (i.e. two standard deviations either side of the mean), $6\sigma$, etc. If a peak in mutual amplitude occurs close to zero shift of the parameters, which is significantly higher than this threshold, then the presence of non-trivial correlations is established. In the correct parameter regime, these correlations are a signature of Majorana zero modes. In another example, a threshold for the absolute value of the mutual information may be set, such that if the mutual information exceeds the threshold, then this is regarded as indicating the presence of a Majorana zero mode pair. In another example, a threshold for the absolute value of the normalized mutual information may be set, such that if the normalized mutual information exceeds the threshold, then this regarded as indicating the presence of a Majorana zero mode pair. In another example, a threshold for the absolute value of the normalized pointwise mutual information may be set, such that if the normalized pointwise mutual information exceeds the threshold, then this regarded as indicating the presence of a Majorana zero mode pair.

Referring to FIG. 9, this shows a flow diagram for an example of a method as described herein. At 901, a first set of data points measuring conductance between a first terminal and a middle terminal of a structure is obtained. As described in more detail above, this may be for different values of bias voltage at the first terminal and at least one other parameter. At 902, a second set of data points measuring conductance between a second terminal and the middle terminal of the structure is obtained. Again, this may be for different values of bias voltage at the first terminal and at least one other parameter. At 903, a measure of mutual information between the first and second data sets is obtained. Finally, at 904, it is determined whether a signature consistent with a pair of Majorana Zero Modes is present in the structure based on the measure of mutual information.

Examples described herein provide for determining whether or not a pair of Majorana Zero Modes is present in a structure, such as for example a semiconductor-superconductor heterostructure or other structure capable of hosting Majorana Zero Modes. This can be used in experiments, for example when experimenting with different physical or topological arrangements of the structure and/or when experimenting with different materials for the structure. This can also be used during actual operation of quantum computer that makes use of such structures. For example, one or more operating parameters of the quantum computer (such as control voltages that are applied to the various terminals, etc. and/or the applied magnetic field) can be adjusted based on the values of the mutual information so as to increase the likelihood that a pair of Majorana Zero Modes are formed in the structure, as required for a quantum computer.

Some aspects of the embodiments described herein with reference to the drawings comprise (classical) computer processes performed in (classical) processing systems or processors. Some aspects also extend to (classical) computer programs, particularly (classical) computer programs on or in a carrier, adapted for putting the invention into practice. The program may be in the form of non-transitory source code, object code, a code intermediate source and object code such as in partially compiled form, or in any other non-transitory form suitable for use in the implementation of processes according to the invention. The carrier may be any entity or device capable of carrying the program. For example, the carrier may comprise a storage medium, such as a solid-state drive (SSD) or other semiconductor-based RAM; a ROM, for example a CD ROM or a semiconductor ROM; a magnetic recording medium, for example a floppy disk or hard disk; optical memory devices in general; etc.

The examples described herein are to be understood as illustrative examples of embodiments of the invention. Further embodiments and examples are envisaged. Any feature described in relation to any one example or embodiment may be used alone or in combination with other features. In addition, any feature described in relation to any one example or embodiment may also be used in combination with one or more features of any other of the examples or embodiments, or any combination of any other of the examples or embodiments. Furthermore, equivalents and modifications not described herein may also be employed within the scope of the invention, which is defined in the claims.

What is claimed is:

1. A method of operating a quantum computer having a structure capable of hosting Majorana Zero Modes, the method comprising:

at a first terminal of the structure capable of hosting Majorana Zero Modes, obtaining a first set of data points measuring conductance between the first terminal and a middle terminal of the structure for different values of bias voltage at the first terminal and at least one other parameter;

at a second terminal of the structure, obtaining a second set of data points measuring conductance between the second terminal and the middle terminal for different values of bias voltage at the second terminal and of the at least one other parameter;

obtaining a measure of mutual information between the first and second data sets;

determining whether a signature consistent with a pair of Majorana Zero Modes is present in the structure based on the measure of mutual information; and automatically adjusting one or more of the bias voltage at the first terminal, the bias voltage at the second terminal, and the at least one other parameter based on the determining to establish the pair of Majorana Zero Modes in the structure.

2. The method according to claim 1, wherein it is determined that a signature consistent with pair of Majorana Zero Modes is present in the structure if the measure of mutual information exceeds a threshold.

3. The method according to claim 2, wherein the threshold comprises a certain number of standard deviations of the mutual information.

4. The method according to claim 2, wherein the threshold comprises an absolute value of the measure of mutual information.

5. The method according to claim 1, wherein the measure of the mutual information comprises a normalized mutual information.

6. The method according to claim 1, wherein the measure of the mutual information comprises a normalized pointwise mutual information.

7. The method according to claim 1, wherein the measure of mutual information between the first and second data sets is obtained by adaptively binning the first set of data points and the second set of data points.

8. The method according to claim 1, wherein the structure comprises a semiconductor-superconductor heterostructure.

9. The method according to claim 8, wherein the semiconductor-superconductor heterostructure comprises a nanowire, the first terminal being at a first end of the nanowire and the second terminal being at a second end of the nanowire.

10. The method according to claim 1, wherein the structure comprises a topological insulator.

11. The method according to claim 1, wherein the at least one other parameter comprises a voltage applied to the middle terminal.

12. The method according to claim 1, wherein the at least one other parameter comprises an intensity of a magnetic field applied to the structure.

13. The quantum computer, the quantum computer being arranged to carry out the method according to claim 1.

14. A quantum computing system, comprising:

a structure capable of hosting Majorana Zero Modes (MZMs);

a processor; and a storage device coupled to the processor and that includes program code that is operable to implement a method of assessing the structure capable of hosting MZMs with the processor, the method including:

obtaining a first set of data points measuring conductance between a first terminal and a middle terminal of the structure for different values of bias voltage at the first terminal and at least one other parameter;

obtaining a second set of data points measuring conductance between a second terminal and a middle terminal for different values of bias voltage at the second terminal and of the at least one other parameter;

obtaining a measure of mutual information between the first and second data sets; and determining whether a signature consistent with a pair of Majorana Zero Modes is present in the structure based on the measure of mutual information; and automatically adjusting one or more of the bias voltage at the first terminal, the bias voltage at the second terminal, and the at least one other parameter based on the determining to establish the pair of Majorana Zero Modes in the structure.

15. The quantum computing system of claim 14, wherein the structure comprises a semiconductor-superconductor heterostructure.

16. The quantum computing system of claim 15, wherein the semiconductor-superconductor heterostructure comprises a nanowire, the first terminal being at a first end of the nanowire and the second terminal being at a second end of the nanowire.

17. The quantum computing system of claim 14, wherein the structure comprises a topological insulator.

18. The quantum computing system of claim 14, wherein the at least one other parameter comprises a voltage applied to the middle terminal.

19. The quantum computing system of claim 14, wherein the at least one other parameter comprises an intensity of a magnetic field applied to the structure.

* * * * *